May 14, 1968 D. O. GALLENTINE 3,382,564

SOLDERING APPARATUS AND METHOD FOR MICROELECTRONIC CIRCUITS

Filed Sept. 27, 1965 4 Sheets-Sheet 1

INVENTOR.
Donal O. Gallentine

BY

B. B. Olive
ATTORNEY

May 14, 1968 D. O. GALLENTINE 3,382,564

SOLDERING APPARATUS AND METHOD FOR MICROELECTRONIC CIRCUITS

Filed Sept. 27, 1965 4 Sheets-Sheet 2

INVENTOR.
Donal O. Gallentine

BY

B. B. Olive
ATTORNEY

May 14, 1968 D. O. GALLENTINE 3,382,564

SOLDERING APPARATUS AND METHOD FOR MICROELECTRONIC CIRCUITS

Filed Sept. 27, 1965 4 Sheets-Sheet 3

INVENTOR.
Donal O. Gallentine

BY

B. B. Olive
ATTORNEY

INVENTOR.
Donal O. Gallentine
BY
B. B. Olive
ATTORNEY

United States Patent Office 3,382,564
Patented May 14, 1968

3,382,564

SOLDERING APPARATUS AND METHOD FOR MICROELECTRONIC CIRCUITS

Donal O. Gallentine, Orlando, Fla., assignor, by mesne assignments, to General Dynamics Corporation, a corporation of Delaware Filed Sept. 27, 1965, Ser. No. 490,431
23 Claims. (Cl. 29—471.1)

ABSTRACT OF THE DISCLOSURE

An apparatus is described for soldering a plurality of leads of a flat-pack type of microelectronic device to a corresponding mating set of leads on a printed circuit board. The flat-pack is received within a flat-pack holder and held therein by means of an applied vacuum. The flat-pack leads are aligned through the use of pins on the flat-pack holder which enter holes in the printed circuit board. The mating leads are engaged by a clamp. Thereafter preheated solder heads move down into engagement with the aligned set of clamped leads to solder the leads to the board.

This invention relates to a soldering apparatus and, more particularly, to an apparatus for soldering the metal leads extending from an integrated microelectronic or microcircuit flat pack to the aligned and corresponding metal leads integrally mounted on a printed circuit board and a method for soldering the same.

In the last few years, the public has witnessed tremendous advancements in the electronics industry. Not only have new systems and circuits been developed but the existing circuits and the components thereof perform extra functions and have been reduced in size to occupy only a fraction of the space originally occupied by their equivalent predecessors. A species of these miniature circuits consists of an integrated microcircuit commonly called a "flat pack" which is in electrical communication with and mounted on a printed circuit board. The microcircuit flat pack which is an integrated circuit has leads which connect a predetermined portion of the microcircuit to leads which have been securely mounted on the printed circuit board. It is imperative that current conducting electrical unions be made between the various pairs of associated leads and that the electrical connections be established only between the intended leads.

The prior art teaches devices for soldering microcircuit leads; however, each joint must be soldered separately and independently from the others. This time consuming operation is expensive and greatly limits the use of microcircuits of this type. To be competitive with discrete electronic circuits in the consumer market, the number of man hours spent in soldering microcircuit leads must be significantly reduced. Furthermore, any new system or method must be adapted to handle non-uniform flat packs since, for example, the leads of the flat pack are sometimes out of alignment with either the top or bottom of the flat pack. One such method which would effect the mentioned reduction in man hour cost would be to align all flat pack leads with their corresponding circuit board leads and simultaneously solder them together thereby making a plurality of electrical unions with one manual operation. Another labor saving device needed by the industry is a means which removes a microcircuit flat pack from a printed circuit board for repair or replacement. Therefore, an object of this invention is to provide a soldering apparatus which simultaneously solders a plurality of microcircuit flat pack leads to their corresponding printed circuit board leads.

Another object of this invention is to provide a method for positioning the leads of a microcircuit flat pack in electrical communication with the leads of a printed circuit board and simultaneously soldering the communicating leads to form a plurality of electrical unions.

A further object of this invention is to provide a soldering apparatus with an adapter which allows the apparatus to solder imperfectly formed microcircuit flat packs on a printed circuit board.

Yet another object of this invention is to provide a soldering apparatus which partially houses a microcircuit flat pack prior to soldering and which subsequently positions the leads of the flat pack in electrical contact with the corresponding leads of a printed circuit board.

Another object of this invention is to provide a soldering apparatus which is effective to remove a soldered flat pack from a printed circuit board.

Still another object of this invention is to provide a soldering apparatus with a temperature control device which maintains the soldering heads at approximately 50° F. above the solder melting point.

A still further object of this invention is to provide a soldering apparatus with a heat sink which is in contact with the microcircuit flat pack leads during the soldering thereof.

Other objects and advantages of the present invention will become apparent and obvious from a study of the following description and the accompanying drawings which are merely illustrative of the present invention.

Figure 1:
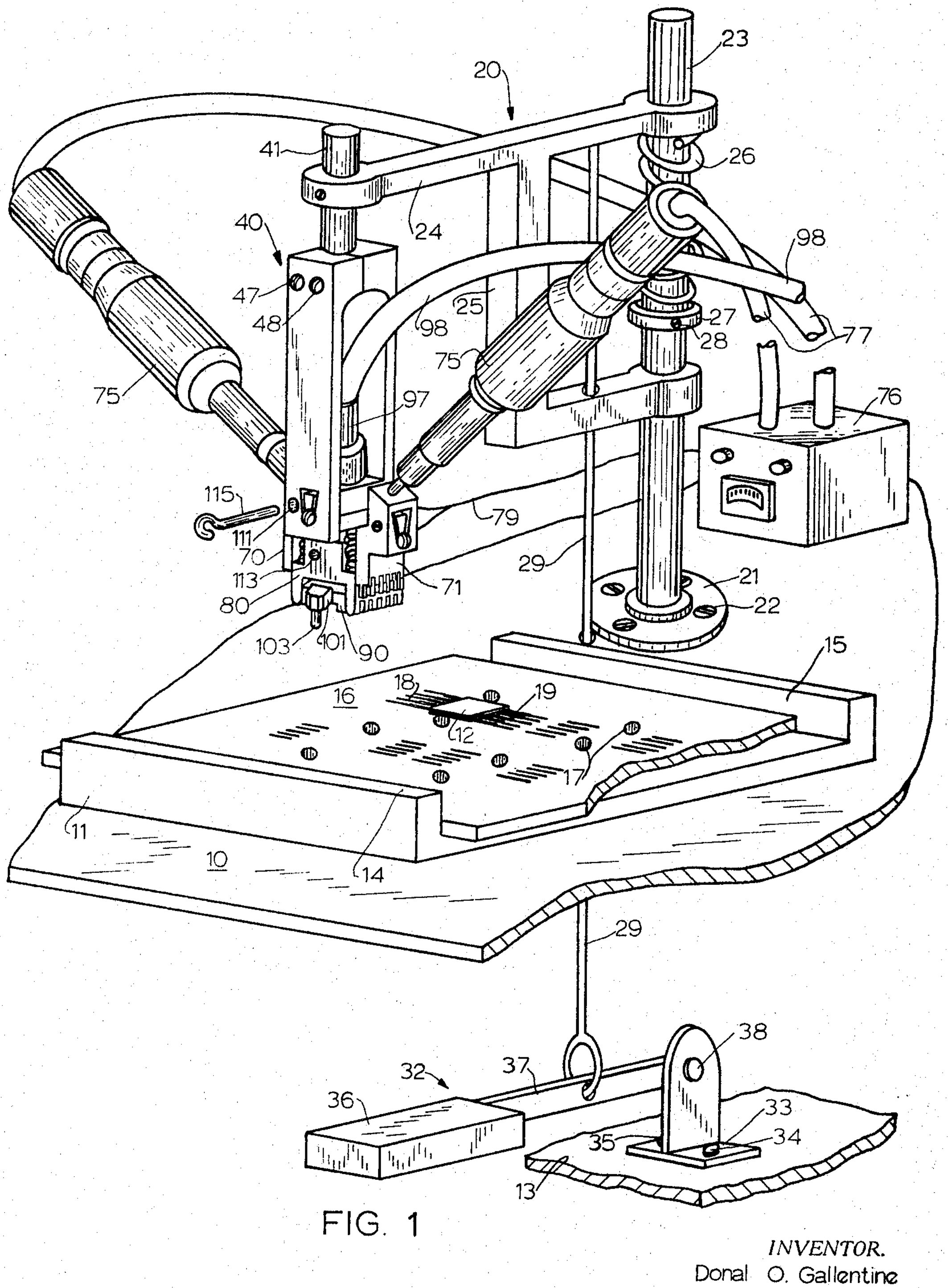
FIGURE 1 is a perspective view of the soldering apparatus showing a portion of the assembly table cut away.
Figure 2:
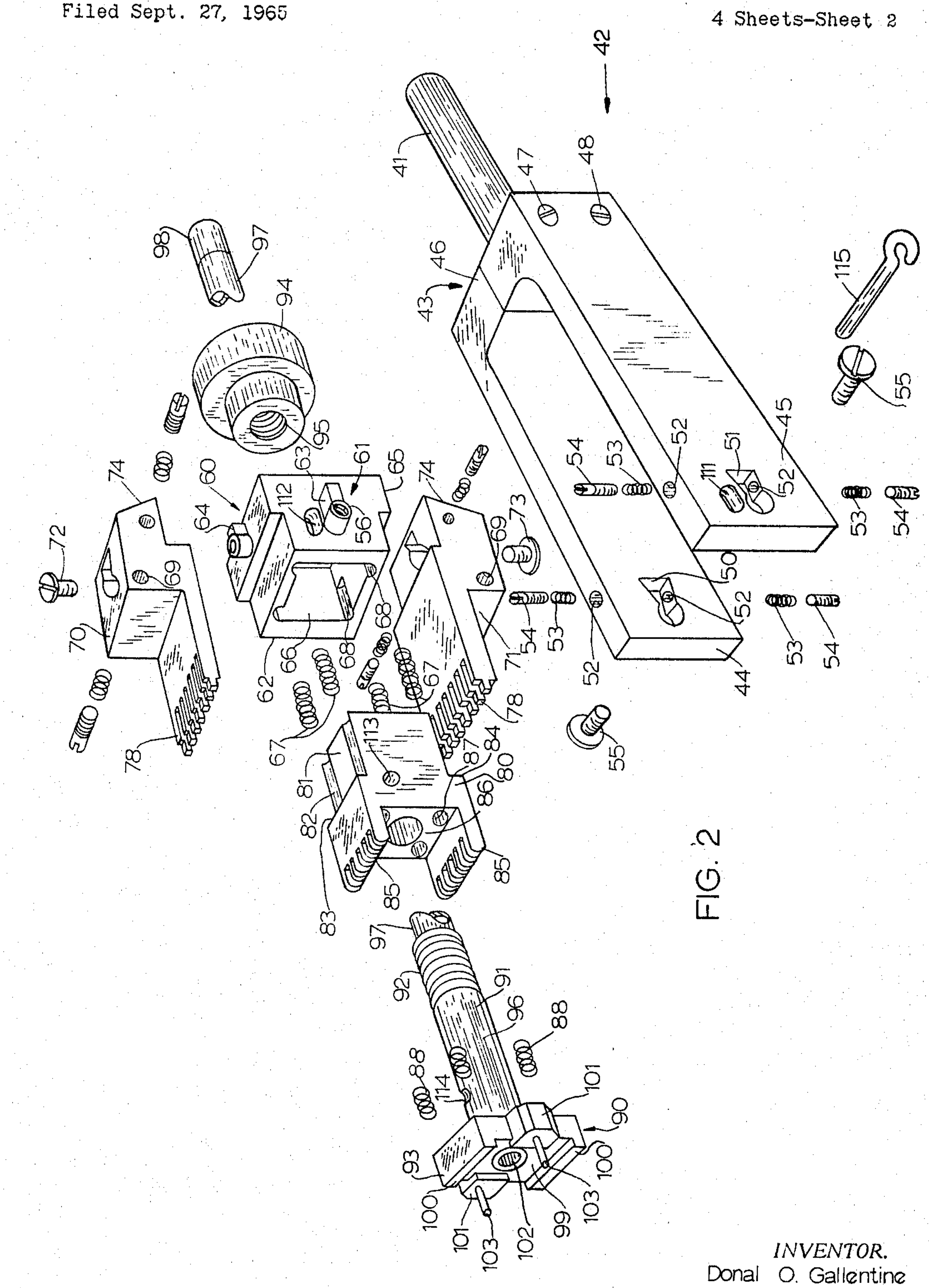
FIGURE 2 is an exploded perspective view of the soldering unit showing its respective elements.
Figure 3:
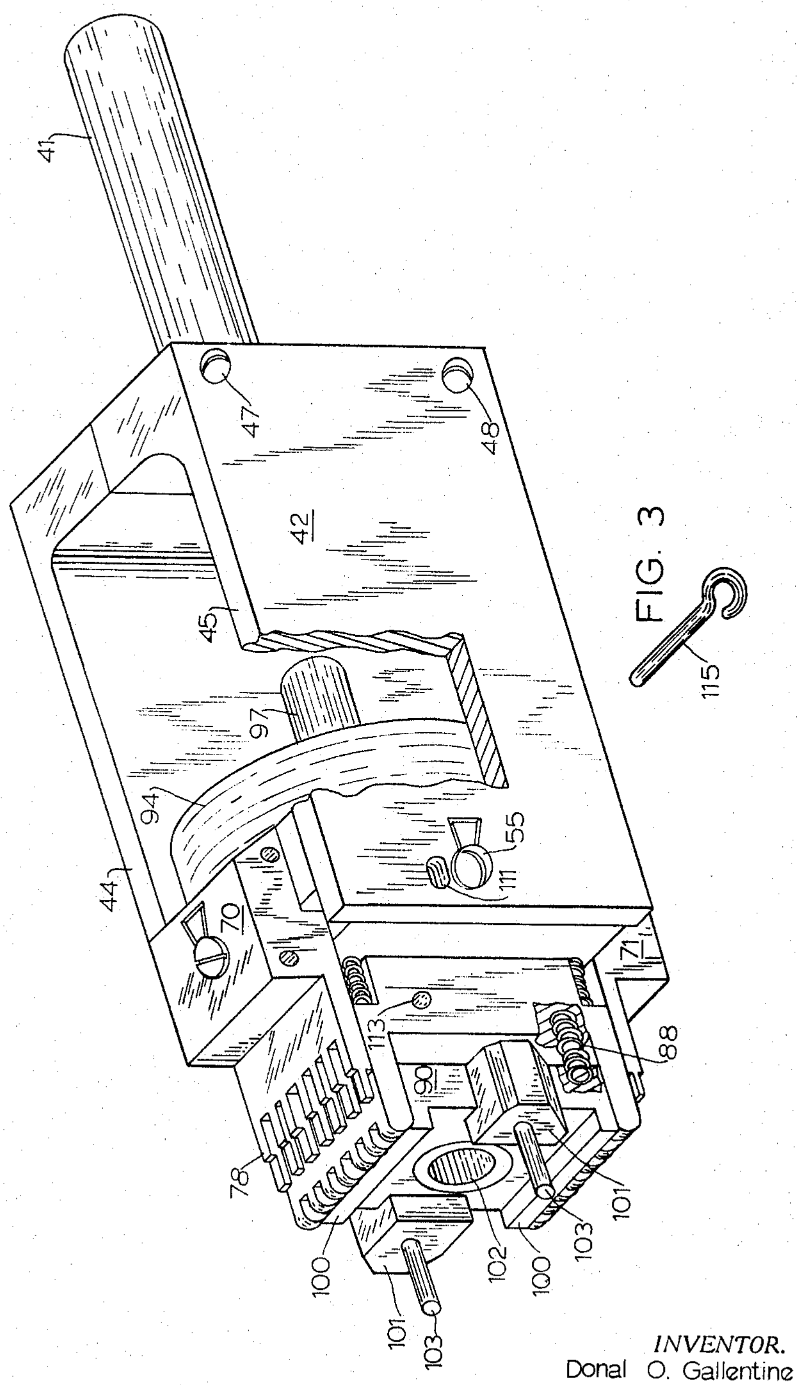
FIGURE 3 is a perspective sectional view of the soldering unit showing the functional relationship among the various elements.
Figure 8:
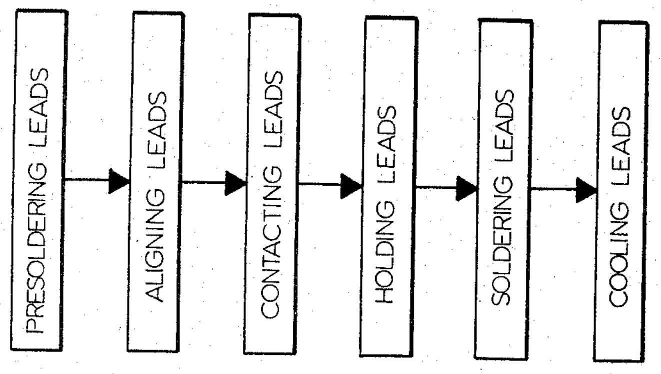
FIGURE 8 is a block diagram showing the various steps used in carrying out the method of this invention.
Figures 4, 5, 6, 7, 9:
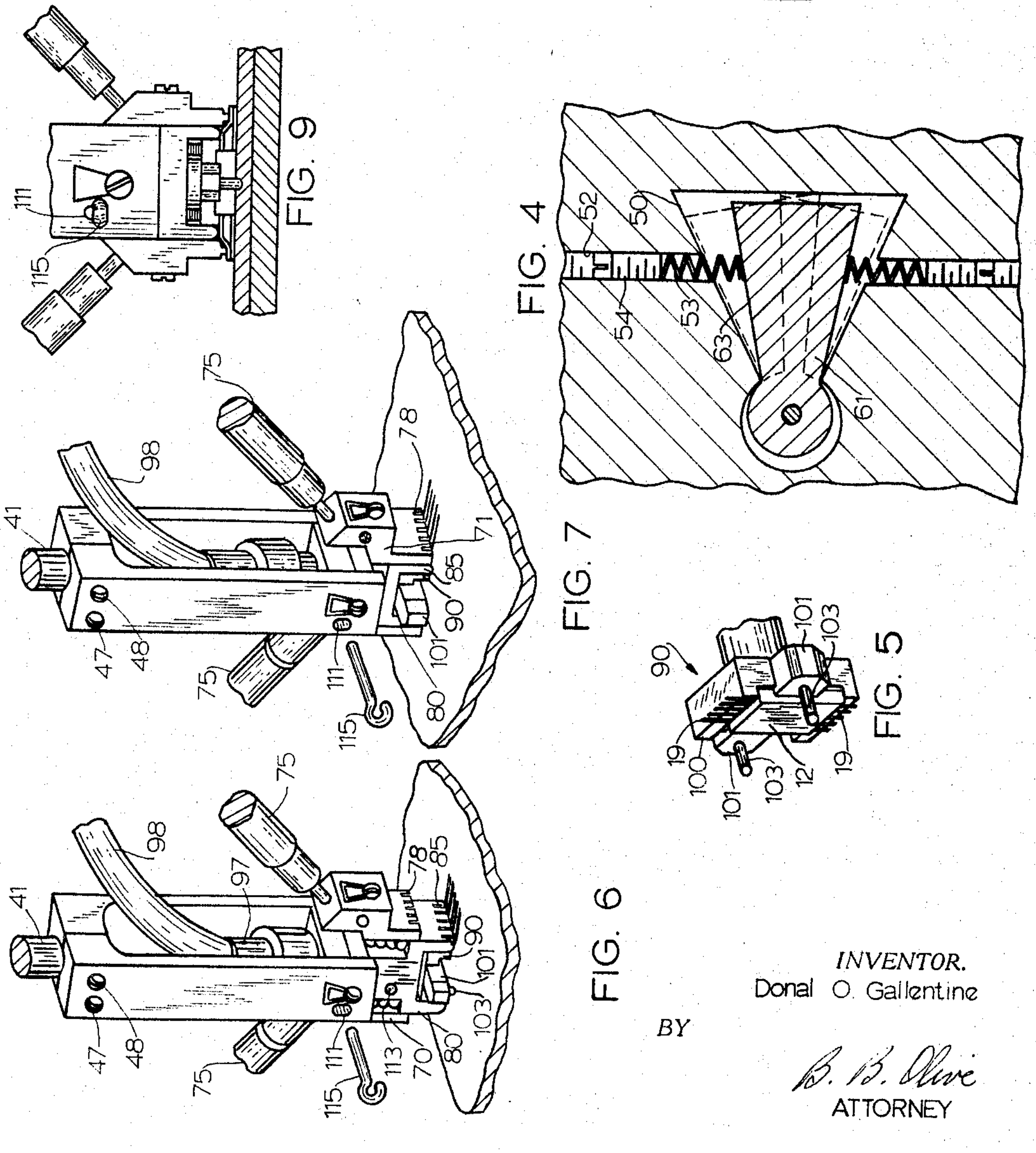
FIGURE 4 is a fragmentary side view of the soldering unit showing the movement of the key in the keyhole.
FIGURE 5 is a fragmentary perspective view of the soldering unit showing the microcircuit flat pack being held by a vacuum on the flat pack holder.
FIGURE 6 is a fragmentary elevational view of the soldering unit having positioned the microcircuit flat pack on the printed circuit and showing the leads clamped together prior to soldering.
FIGURE 7 is a fragmentary elevational view of the soldering unit having positioned the microcircuit flat pack on the printed circuit board and being operative for soldering the respective leads.
FIGURE 9 is a fragmentary elevational view of the soldering unit having the locking pin inserted therein showing the apparatus in position to remove a microcircuit flat pack from a printed circuit board.

One embodiment of this invention contemplates soldering of the leads of a microcircuit flat pack to those of a printed circuit board by inserting the flat pack in a flat pack holder which is an integral part of the soldering unit, lowering the soldering unit until the flat pack is firmly positioned against the printed circuit board and the leads of the flat pack are in alignment with the corresponding leads of the circuit board and soldering all corresponding leads simultaneously whereby the flat pack is firmly secured to the circuit board and is in electrical communication therewith.

The microcircuit flat pack is a commercially available item and is generally comprised of an integrated circuit which is housed in a flat modular package. The package generally includes an upper and a lower plate between which the integrated circuit resides to form a composite sandwich. Any number of metal ribbons or leads, depending on the nature of the circuit, are joined to the integrated circuit and extend outwardly between the plates. A variety of materials may be used for the flat pack leads including copper, gold-plated materials and the like and these leads within the flat pack may be connected to various forms of thin film or substrate circuitry.

The soldering apparatus is comprised of a soldering unit which is mounted to pivot around a plurality of axis and is securely fastened to a vertically movable spring-loaded frame. The spring-loaded frame is supported on a table and has a cable or wire extending through the table which is connected to a foot operated pedal. The circuit plate or pad to which the flat pack is to be soldered is slidably mounted on the table to facilitate the alignment of the leads on the circuit board with the leads extending from the microcircuit flat pack.

The soldering unit functions to receive and hold a microcircuit flat pack by means of vacuum applied to the flat pack and is adapted to align the flat pack with and solder the flat pack to the circuit plate. The soldering unit includes a U-shaped fork which has a post extending outwardly from the vertex of the U that is rigidly received by an arm of the frame. The fork is provided with a pair of rectangularly shaped and parallelly disposed legs each having a key slot at the extremities thereof which are axially aligned and extend perpendicularly through the surface portions thereof. A rectangular solder head block having a key extending outwardly from each side thereof is pivotally received by the fork by having each solder head block key journaled in a respective fork keyhole. The flange portion of each key is smaller than the fan opening of the respective keyhole in which it fits thereby allowing the solder head block to pivot in one plane through a predetermined arc about the shaft portion of the key. A pair of solder heads also having key slots are pivotally mounted on respective solder head block keys and are allowed to rotate through an arc about an axis which is perpendicular to the axis about which the solder head block pivots. Since the solder heads are mounted on the solder head block, they obtain the benefit of being rotatable through that perpendicularly arranged arc; therefore, the solder heads are adapted to universally pivot in either direction. Such an arrangement is particularly advantageous in dealing with non-uniform flat packs.

The solder head block is hollow and slidably receives a portion of a spring actuated lead clamp. The lead clamp moves in the solder head block like a piston sliding in a cylinder and has a pair of shoulders which limit the travel in the direction which compresses the springs. The shoulders extend downwardly and form a pair of combs which consist of teeth that individually clamp a flat pack lead to a corresponding printed circuit board lead. The lead clamp is provided with a passageway which extends lengthwise therethrough for slidably receiving a portion of a hollow shaft that is an integral extension of a flat pack holder. The flat pack holder has a portion which is generally perpendicularly arranged with respect to the hollow shaft and is provided with a recessed area for snugly receiving a microelectronic flat pack. The flat pack is securely held therein by means of a vacuum that is induced in the hollow shaft by means of a vacuum pump. The flat pack holder is also provided with a pair of positioning pins which are parallel to each other and to the hollow shaft and which are selectively received by various pair of aligning holes which are located in the printed circuit board, one pair of aligning holes being provided on the printed circuit board for each flat pack location. The hollow shaft has a first smooth external portion adjacent the area which includes the pins, a threaded portion and a second smooth portion. The first smooth portion slidably resides in the solder head block. The threaded section of the shaft is threadably received by a collar which acts as a stop against the elements which are spring loaded under compression in the direction being axial with the hollow shaft. The second smooth portion of the hollow shaft extends upwardly from the collar and is adapted to receive a line which is connected to the vacuum pump.

The solder heads are heated by providing the same with a resistive element such as that manufactured by Ungar of Hawthorne, Calif. The temperature of the solder heads is maintained at approximately 50° F. above the flow point of the solder, which in this instance is about 400° F., by any temperature sensing device such as a thermocouple. The temperature sensing device is connected to a voltage supply which feeds the resistive elements and by a standard feed back arrangement, the temperature of the solder heads may be maintained within a selected range.

The soldering unit is rigidly mounted on the end of an arm which is a part of and which extends outwardly from the previously referred to spring loaded frame. The subject frame includes an arm support which is connected to the arm, a post which is rigidly secured to a table and which slidably receives the arm and arm support and a compression spring which is secured at one end to the post and compressively supports the arm. As previously mentioned, the frame also includes a slender rod which extends therefrom, through the table and is connected to a foot operated pedal which may be secured to the floor. The operator brings the soldering unit into communication with the printed circuit board by pushing the pedal downwardly and overcoming the force of the compression spring which action vertically positions the frame, arm and soldering unit. When the foot pedal is released, the spring forces the frame upwardly into an equilibrium position.

The printed circuit board itself is adapted to be moved into any position in the plane of the supporting table and is received by a channel member which provides a convenient means for holding the printed circuit board. The printed circuit board is provided with the previously mentioned plurality of pairs of selectively spaced holes which are perpendicular to the surface of the board and which correspond to the various locations at which flat packs are to be installed. Each pair of holes receives the pair of pins which are mounted on the flat pack holder thereby positioning the soldering unit when lowered into communication therewith into a position for selectively placing the microcircuit flat pack on the printed circuit board and for firmly holding the flat pack and circuit board in fixed positions while the soldering or welding operation takes place.

The embodiment of the invention referred to herein discloses a movable board and a stationarily positioned soldering unit which is movable in the vertical direction. However, the invention also contemplates having a soldering unit which while being movable in the vertical direction is also movable in the horizontal direction. In other words, the soldering unit may be adapted to be moved into a position of alignment with the holes on a stationarily mounted printed circuit board rather than having a movable printed circuit board which is alignable with a stationarily mounted soldering unit.

It is contemplated that the flat pack soldering apparatus is adapted for removing damaged or worn flat packs from a printed circuit broad. An elongated slot is drilled in one leg of the U-shaped fork, a similar slot is placed in the solder head block, a hole is drilled in the spring actuated lead clamp and a groove is located in the side of the hollow shaft of the flat pack holder. The slots, hole and groove are so placed in their respective members that when the lead clamp is slid into the solder head block to its limiting position therein and the flat pack holder remains at its prior resting position, they are in substantial alignment and are adapted to receive a locking pin. With the locking pin inserted therein, the flat pack holder stationarily resides in the lead clamp so that when the flat pack holder pushes the flat pack against the printed circuit board, the combs of the lead clamp do not engage the flat pack leads and thereby do not act as a heat sink. The slots in the solder head block and the U-shaped fork allow the lead clamp a limited travel.

The invention is illustrated in connection with the accompanying drawings in which the figures are illustrative of the preferred embodiment of the invention.

A table 10 which may be considered the reference base for the invention is securely mounted to a floor 13 and may be an individual unit or part of a long working table. Table 10 has selectively positioned thereon a rack or printed circuit board holder 11 which slidably rests on table 10. Holder 11 is provided with parallel shoulders 14 and 15 which serve as a holding means for a printed circuit board 16. When printed circuit board 16 is received by shoulders 14 and 15, holder 11 is adapted to slide printed circuit board 16 into position to receive microcircuit flat pack 12. Printed circuit board 16 is provided with a plurality of pairs of holes 17 drilled perpendicularly therethrough which aid in the alignment of printed circuit board 16 with respect to microcircuit flat pack 12 and which prevent relative movement between the flat pack and board. Each pair of holes corresponds to a flat pack location.

A frame structure 20 is mounted on table 10 by any means such as collar and screw arrangement 21 and 22 respectively. Frame 20 includes a post 23 which is vertically mounted on table 10 and secured to collar 21. Slidably mounted on post 23 is an arm 24 which receives soldering unit 40 and includes an integral elbow 25. Elbow 25 extends downwardly from arm 24 and also has a portion which is slidably mounted on post 23; elbow 25 is adapted to provide vertical rigidity to arm 24. A compression coil spring 26 which spirally encompasses a portion of post 23 is stationarily positioned thereon by resting against ring 27 which is rigidly secured to post 23 by set screw 28. Arm 24 is lowered into engagement with the upper extended portion of spring 26 and is supported thereby. To vertically lower frame 20 along post 23 and thereby lower soldering unit 40, a slender rod 29 is connected to frame 20 and extends downwardly through table 10 where it is connected to a foot operated means 32. Foot means 32 includes a clamp 33 which is secured to a floor 13 by means of bolts 34 and 35 and a pedal 36 which is connected to clamp 33 by means of an arm 37 which is rotatably mounted on a bolt 38. A downward force on pedal 36 by the operator's foot moves frame 20 downwardly and causes the spring 26 to be compressed whereby upon a release of the force on pedal 36, spring 26 returns frame 20 to its original non-operative position.

Soldering unit 40 is connected to arm 24 of frame 20 by a post 41 which comprises a handle portion of fork 42. Fork 42 has a U-shaped portion 43 which includes a pair of rectangularly shaped and parallelly disposed legs 44 and 45 which have portions forming a vertex 46 and are held together by screws 47 and 48. Legs 44 and 45 are each provided with a key slot 50 and 51 and each side of each key slot has a partially threaded passageway 52 that extends to a laterally disposed surface of the respective leg. Each passageway 52 is provided with a spring 53 and a set screw 54 which limits the spring's action in one direction. Leg 45 includes a locking slot 111 which has its axis in parallel with that of key slot 51.

A tetrahedron shaped substantially hollow solder head block 60 is adapted to be pivotally mounted in fork 42 by keys 61 and 62 (not shown). Each key has a flange 63 which resides in the flare portion of its respective key hole in fork 42. Springs 53 of fork 42 engage the side of each flange 63 and vertically stabilize the same. Bolts 55 are threadably received by threaded openings 56 in keys 61 and 62. Solder block head 60 also includes a second set of keys 64 and 65 which are mounted on parallel surfaces being perpendicularly disposed from the surfaces on which keys 61 and 62 are mounted. Solder head block 60 is provided with a cavity 66 and groove portions 68 in cavity 66 which receive springs 67. Extending through one surface of solder head block 60 is an elongated slot 112 which is similar in shape to and is in axial alignment with locking slot 111.

Solder heads 70 and 71 are pivotally mounted on keys 64 and 65, respectively, and are secured thereon by screws 72 and 73 which are threadably received by keys 64 and 65. Solder heads 70 and 71 are provided with set screws and springs which limit the direction of pivot as previously described for the solder head block. Each solder head has a sloped upper surface which has a threaded hole extending perpendicularly downwardly from said surface. The threaded hole receives a heating element 75 which is connected to a temperature controller 76 by means of cable 77. Solder heads 70 and 71 each have a temperature sensing wire 79 extending therefrom to the temperature controller 76. Each sensing wire 79 connects with a suitable thermocouple (not shown) mounted in holes 69 provided in the solder heads 70 and 71.

Solder heads 70 and 71 are each provided with a plurality of fingers 78 which are arranged in a bank to form a comb. Each set of fingers 78 is spaced to individually engage the leads of a microcircuit flat pack 12 and is maintained at a predetermined temperature by its respective heating element 75. To cooperate with solder heads 70 and 71, soldering unit 40 is provided with a lead clamp 80 which is adapted to have a portion 81 thereof slidably mounted in solder head block 60. Slidably mounted portion 81 is provided with grooves 82 which cooperate with the grooves 68 of solder head block 60 to house springs 67 which provide a compression force in the vertical direction. Springs 67 also act to separate solder head block 60 from lead clamp 80. Lead clamp 80 includes a pair of shoulders 83 and 84 which limit the upward travel of the slidable portion 81 in solder head block 60 and which extend downwardly to form teeth 85. Teeth 85 serve to position the flat pack leads against the printed circuit board leads and hold them in contact thereby readying the same to be soldered by fingers 78 of solder head 70 and 71. Lead clamp 80 is provided with a passageway 86 which extends therethrough and also with a plurality of small openings 87 which house a portion of springs 88. Lead clamp 80 further includes a hole 113 which extends from a flat surface thereof to passageway 86. Hole 113 is postioned to be adjacent to and in axial alignment with elongated slot 112 when shoulders 83 and 84 of lead clamp 80 are substantially in contact with solder head block 60.

To complete the structure of soldering unit 40, a flat pack holder 90 having a shaft 91 with a threaded portion thereof 92 spaced away from a flat pack holder head 93 is suitably received by a collar 94 having a threaded opening 95. The first smooth portion 96 of shaft 91 is slidably mounted in the passageway 86 of lead clamp 80 and the second smooth portion 97 is connected to a flexible pipe 98. First smooth portion 96 is provided with a groove 114 which is in alignment with and adjacent to hole 113 when flat pack holder 90 is in an extended or resting position. Holder head 93 is provided with a recessed surface 99 which is defined by pin mounts 101 and shoulders 100. Passageway 102 which extends from recessed surface 99 through shaft 91 supplies a vacuum to recessed surface 99 thereby adapting that surface to receive and hold microcircuit flat pack 12. Mounts 101 are each provided with a pin 103 thereby forming a pair of pins which are adapted to reside in any pair of spaced holes 17 on printed circuit board 16.

Prior to operation of the invention, the leads 18 of printed circuit board 16 and the leads 19 of microcircuit flat pack 12 are presoldered. Printed circuit board 16 is placed in position by the operator by sliding plate holder 11 on table 10 until the desired pair of holes 17 in printed circuit board 16 are directly beneath and in a position to receive pins 103 of soldering unit 40. It may be recalled here that there is a pair of holes for each desired flat pack location. Solder heads 70 and 71 are preheated by temperature control 76 to the desired temperature and the vacuum pump (not shown) creates a negative pressure in line 98. The operator inserts a microcircuit flat pack in cavity 99 of flat pack holder 90 and the same is securely held therein by the negative pressure which causes the flat pack to snugly reside against flat pack holder 90. The operator forces slider rod 29 downwardly by stepping on pedal 36 which in turn pulls arm 24 against spring 26 and forces arm 24 downwardly on post 23. Pins 103 enter holes 17 and in doing so serve to complete the aligning of the corresponding leads of the flat pack circuit and the printed circuit board together. So long as pins 103 and holes 17 remain engaged relative movement between the flat pack and board is prevented which is especially desired during the soldering.

After the flat pack has engaged the printed circuit board, springs 88 which coact with springs 67 force collar 94 against solder head block 60 thereby spring loading lead clamps 80 as well as flat pack holder 90. The springs 88 preferably have substantially less resilience than do springs 67. Therefore, when flat pack holder 90 engages circuit plate board 16, end portions 93 of holder 90 will be forced against lead clamp 80 before the lead clamp begins to slide inwardly into solder head block 60. In that position, teeth 85 impinge against and force flat pack leads 19 against printed circuit board leads 18. With the leads firmly in position, the lead clamp 80 tends to slide inwardly into opening 66 of solder head block 60 thereby causing solder or heating heads 70 and 71 to come downwardly and into a touching position with leads 18 and 19. Since the temperature of the ends of fingers 78 is above the solder flow point, the solder melts and forms a junction or union between each pair of contacting leads. The heat supplied to the leads is prevented from traveling along the leads to the microcircuit flat pack since teeth 85 of lead clamp 80 are in a touching relation therewith and act as a heat sink to lower the temperature thereof to a noncritical level. After the leads have been soldered, the operator raises his foot thereby causing spring 26 which has been compressed to force frame 20 upwardly thereby picking soldering unit 40 up and away from the soldering area. The same process is repeated until microcircuit flat packs have been installed at each flat pack location on the printed circuit board as identified by the various pairs of holes 17.

To remove flat pack 12 from printed board 16, lead clamp 80 is forced inwardly into solder head block 61 until hole 113 is adjacent elongated slot 112 and is in axial alignment with elongated slot 112 and locking slot 111. Flat pack holder 90 is not pushed inwardly into lead clamp 80 for groove 114 and hole 113 are already adjacent each other. A locking pin 115 is then inserted through slots 111 and 112, through hole 113 and into groove 114. Since slots 111 and 112 are slightly elongated in the vertical direction, lead clamp 80 and flat pack holder 90 which is rigidly pinned therein by locking pin 115 are allowed a limited vertical travel. Therefore, once flat pack holder 90 is placed on flat pack 12 and a vacuum is created in passageway 102, heated fingers 78 are aligned with leads 18 and 19 and by pressing downwardly on foot pedal 32, heated fingers 78 are brought into contact with the soldered printed circuit board leads 18 and flat pack leads 19. When the solder joining adjacent leads 18 and 19 has begun to flow or melt, foot pedal 32 is released thereby raising soldering unit 40 and flat pack 12. Lead clamp 80 is allowed only a limited travel so that flat pack holder 90 is permitted to raise flat pack 12 from printed circuit board 16 before the liquid solder surrounding leads 18 and 19 has begun to harden. By removing locking pin 115 from soldering unit 40, the soldering apparatus is adapted once again to simultaneously solder the leads of a flat pack to the leads of a printed circuit board.

Many different embodiments of this invention may be made without departing from the scope and spirit thereof. Therefore, it is to be understood that the invention is not to be limited to the specific embodiment shown and described herein, except as defined in the appended claims.

For example, either one or both of the sets of flat pack and circuit board leads may have a pre-solder. The means for moving the soldering apparatus of the invention between non-operative and operative positions may be an electrical solenoid, air cylinder or similar means. Also, the flat pack holder may be arranged to be fixed and the circuit board moved towards it or both the flat pack and board may be moved together. Magnetic or other types of holding effects may be used in place of the disclosed vacuum elements in combination with other elements of the invention. The aligning procedure may take place by moving the board and leaving the flat pack fixed as disclosed or by mounting the flat pack such that it can be moved relative to the board. Other pivoting mechanisms for adapting the apparatus to uneven or non-uniform surfaces of flat pack and board constructions may also be used within the scope of the invention.

What is claimed is:

1. An apparatus for simultaneously soldering a set of leads extending from an integral circuit pack to a corresponding set of leads residing on a circuit board, at least one of said sets having a pre-solder, comprising:
   (a) first means for supporting said circuit board in a first plane,
   (b) second means for receiving said pack and holding the same in a plane opposite and substantially parallel to said first plane, said pack and circuit board being shiftable in said planes relative to each other thereby allowing said sets of leads to be substantially aligned,
   (c) third means for bringing said first and second means together whereby said pack and board become engaged and said substantially aligned sets of leads are brought into contact substantially simultaneously whereby each individual lead of said pack contacts and is held against its mating lead of said circuit board, and
   (d) fourth means for substantially simultaneously heating each of the various junctions of said contacting leads to a temperature sufficient to cause said pre-solder to flow and form electrical unions at each such junction.

2. In the apparatus of claim 1 including means operable during contact of said leads for preventing relative movement between said pack and board during said heating.

3. In the apparatus of claim 1 wherein said second means comprises a vacuum coupling arranged to receive and hold said pack by means of vacuum applied thereto.

4. In the apparatus of claim 1 wherein said fourth means is slidably mounted on said second means and arranged such that said heating is effected subsequent to said mating leads being brought into contact.

5. An apparatus for simultaneously soldering a set of leads extending from a microcircuit flat pack to a corresponding set of leads residing on a printed circuit board, at least one of said sets having a pre-solder, comprising:
   (a) support means for supporting said circuit board in a first fixed substantially horizontal plane,
   (b) holding means for receiving said microcircuit flat pack and holding the same in a second horizontal plane opposite said printed circuit board, said flat pack and board being shiftable in said planes relative to each other thereby allowing said sets of leads to be substantially aligned while being held apart,
   (c) positioning means for lowering said holding means to said support means to bring said microcircuit flat pack into engagement with said printed circuit board and for engaging and pressing said leads of said microcircuit flat pack individually, simultaneously and into contact only with said corresponding and mating leads of said printed circuit board, and (d) heating means for simultaneously forming an electrical union between said contacting leads while said positioning means maintains contact between said leads by heating said leads at each of a plurality of selected points of contact to a temperature sufficient to cause said solder to flow, said heating means being universally pivotally mounted on said positioning means thereby adapting said heating means to seat on uneven surfaces.

6. An apparatus as claimed in claim 4 wherein said holding means comprises a vacuum coupling arranged to receive and hold said flat pack.

7. An apparatus for simultaneously soldering a set of leads extending from a microcircuit flat pack to a corresponding set of leads residing on a printed circuit board, at least one of said sets having a pre-solder, comprising:

(a) frame means mounted on a base, said frame means adapted to be forced downwardly in a plane perpendicular to said base and having internal means for returning said frame to a resting position;

(b) means slidably mounted on said base for receiving said printed circuit board; and (c) a soldering unit mounted on said frame means and being comprised of:

(1) a housing having an extension thereof connected to said frame means, (2) holding means mounted in said housing for receiving and holding said microcircuit flat pack in a position opposite said board, (3) clamping means mounted in said housing and adapted to engage and press said leads of said microcircuit flat pack individually and simultaneously into contact with said corresponding and mating leads of said printed circuit board when said frame means has been forced into a downwardly extending position, and (4) heating means attached to said housing for simultaneously forming an electrical union between all said contacting leads by heating said leads at each of a plurality of selected points of contact to a temperature sufficient to cause said solder to flow while said clamping means maintains said contact between said corresponding and mating leads.

8. The soldering apparatus of claim 7 wherein said soldering means is universally pivotally mounted on said housing thereby adapting said soldering means to seat on uneven surfaces.

9. The soldering apparatus of claim 8 including means for maintaining the portions of said soldering means which contact said leads at a relatively constant temperature.

10. The soldering apparatus of claim 9 wherein said holding means comprises a vacuum coupling arranged to receive and hold said flat pack when vacuum is applied thereto.

11. An apparatus for simultaneously soldering a set of leads extending from a microcircuit flat pack to a set of corresponding and aligned leads residing on a printed circuit board, at least one of said sets having a pre-solder, comprising:

(a) a table having a smooth flat surface;

(b) a frame mounted on said table and including an arm;

(c) a rack slidably mounted on said smooth surface for receiving said printed circuit board;

(d) a soldering unit comprising:

(1) a U-shaped housing having a pair of parallel leg portions, a vertex connecting said leg portions and being rigidly connected to said arm of said frame, (2) a head block mounted in said housing between said leg portions, said head block having a passageway therethrough, (3) a lead clamp slidably mounted in said head block passageway and having lead-engaging teeth extending downwardly therefrom, said lead clamp being provided with an opening extending therethrough, (4) a collar mounted on said head block and having a bore in axial alignment with said passageway in said head block, (5) a flat pack holder having a flat pack receiving surface and a hollow shaft extending perpendicularly therefrom, said flat pack holder providing a passageway extending from said receiving surface through said shaft, said shaft having a first outer surface portion extending from said flat pack receiving surface for a selected distance and being slidably mounted in said opening of said lead clamp, a second outer surface portion extending from said first outer surface portion for a distance and being secured in said collar to limit the downward travel of said shaft, and (6) a soldering head mounted on said head block and having lead-engaging fingers extending downwardly therefrom and aligned with said teeth of said lead clamp; and (e) means connected to said arm of said frame for moving said arm downwardly whereby said flat pack holder places said flat pack on said printed circuit board, said lead clamp slides downwardly upon said flat pack shaft whereupon the teeth of said lead clamp simultaneously engage the leads of said flat pack and force them against their respective corresponding and mating leads on said printed circuit board in a holding relationship and said lead clamp slides upwardly into said solder block thereby permitting the fingers of said soldering head to simultaneously engage their respective pair of leads at a selected point to form an electrical union between the leads comprising said pair by supplying heat thereto sufficient to cause said solder to flow.

12. The soldering apparatus of claim 11 including means for maintaining said fingers of said soldering head at a relatively constant temperature.

13. The soldering apparatus of claim 12 wherein a vacuum source is connected to said second surface portion of said flat pack holder shaft thereby adapting said flat pack holder to secure said microcircuit flat pack to said receiving surface by means of a vacuum being created in said passageway of said flat pack holder shaft.

14. The soldering apparatus of claim 13 wherein said solder head block is pivotally mounted between said leg portions of said U-shaped housing and said soldering head is pivotally mounted on said solder head block thereby providing said soldering head with a universal pivot and adapting same to seat on uneven surfaces.

15. The soldering apparatus of claim 14 wherein said flat pack holder is spring loaded in said lead clamp and said lead clamp is spring loaded in said solder block holder holder whereby when said soldering unit is forced downwardly against said printed circuit, said flat pack holder overcomes the force exerted thereon by said springs and slides into a position adjacent said lead clamp whereupon said lead clamp with the force exerted thereon by said flat pack holder overcomes the force exerted thereon by said springs and slides into said passageway in said head block.

16. The soldering apparatus of claim 15 wherein in combination therewith said printed circuit board is provided with a plurality of pairs of holes and said flat pack holder is provided with a pair of pins being adapted to be received by each pair of said holes whereby said holes define the sites on said printed circuit board which are to receive said flat packs and said pins when received by said holes maintain the alignment of said leads of said flat pack at each respective site with said leads of said printed circuit board.

17. A method for soldering the set of leads of a microcircuit flat pack to the corresponding and mating set of leads on a printed circuit board comprising the steps of:

(a) pre-soldering at least one of said sets of leads;
(b) simultaneously aligning all said leads of said microcircuit flat pack with their corresponding and mating leads of said printed circuit board while maintaining said flat pack and circuit board in opposed substantially parallel planes;
(c) bringing said flat pack and circuit board together while simultaneously forcing each lead of said microcircuit flat pack against its corresponding and mating lead of said printed circuit board thereby forming a plurality of pairs of contacting leads;
(d) simultaneously heating each said pair of contacting leads at a selected point along the length thereof to a temperature which causes said solder on said touching leads to flow and mix; and
(e) then discontinuing said heating after a predetermined time.

18. The method of claim 17 including during said heating the step of individually engaging and holding each of said microcircuit flat pack leads securely against each aligned and mating lead of said printed circuit board.

19. The method of claim 18 including the step of simultaneously draining said heat from each of said pair of leads at points remote from said flat pack thereby causing said mixed solder to harden and form an electrical union between each lead of said microcircuit flat pack and its corresponding and mating lead of said printed circuit board without transfer of said heat to said flat pack.

20. An apparatus for selectively removing a set of microcircuit flat pack leads from its position of soldered contact with the printed circuit board leads and for simultaneously soldering a set of leads extending from a microcircuit flat pack to a set of corresponding and aligned leads residing on a printed circuit board, at least one of said sets having a pre-solder, comprising:

(a) a table having a smooth flat surface;
(b) a frame mounted on said table and including an arm;
(c) a rack slidably mounted on said smooth surface for receiving said printed circuit board;
(d) a soldering unit comprising:
    (1) a U-shaped housing having a pair of parallel leg portions, a vertex connecting said leg portions and being rigidly connected to said arm of said frame,
    (2) a head block mounted in said housing between said leg portions, said head block having a passageway therethrough,
    (3) a lead clamp slidably mounted in said head block passageway and having lead-engaging teeth extending downwardly therefrom, said lead clamp being provided with an opening extending therethrough,
    (4) a collar mounted on said head block and having a bore in axial alignment with said passageway in said head block,
    (5) a flat pack holder having a flat pack receiving surface and a hollow shaft extending perpendicularly therefrom, said flat pack holder providing a passageway extending from said receiving surface through said shaft, said shaft having a first outer surface portion extending from said flat pack receiving surface for a selected distance and being slidably mounted in said opening of said lead clamp, a second outer surface portion extending from said first outer surface portion for a distance and being secured in said collar to limit the downward travel of said shaft, and
    (6) a soldering head mounted on said head block and having lead-engaging fingers extending downwardly therefrom and aligned with said teeth of said lead clamp;
(e) means connected to said arm of said frame for moving said arm downwardly whereby said flat pack holder places said flat pack on said printed circuit board, said lead clamp slides downwardly upon said flat pack shaft whereupon the teeth of said lead clamp simultaneously engage the leads of said flat pack and force them against their respective corresponding and mating leads on said printed circuit board in a holding relationship and said lead clamp slides upwardly into said solder block thereby permitting the fingers of said soldering head to simultaneously engage their respective pair of leads at a selected point to form an electrical union between the leads comprising said pair by supplying heat thereto sufficient to cause said solder to flow; and
(f) means associated with said soldering unit for rigidly locking said hollow shaft of said flat pack holder in said lead clamp and for limiting the travel of said lead clamp in said head block whereby said lead clamp is prohibited from contacting said leads and said solder heads are positioned adjacent said leads when said flat pack is in contact with said flat pack holder.

21. A method of removing a microcircuit flat pack from a printed circuit board where the leads of the microcircuit flat pack have been individually soldered to an aligned and corresponding lead of the printed circuit board thereby forming a plurality of pairs of soldered leads comprising the steps of:

(a) positioning a bank of heated fingers which extend from a soldering element above a plurality of pairs of soldered flat pack and circuit board leads so that each heated finger is selectively matched with and is in vertical alignment with a pair of soldered leads;
(b) simultaneously lowering each of said heated fingers into contact with its aligned pair of soldered flat pack and circuit board leads at the soldered union joining said leads;
(c) simultaneously heating each of said soldered unions which join each pair of said leads to a temperature sufficient to melt said solder;
(d) raising said bank of heated fingers; and
(e) simultaneously removing said microcircuit flat pack leads from their mating printed circuit board leads while said solder is in said molten state.

22. Method for soldering a plurality of leads of microelectronic device to a corresponding mating set of leads on a printed circuit board comprising the steps of (a) firstly, aligning the corresponding leads on top of each other,
(b) secondly, clamping the corresponding leads by means of a lead clamp, and
(c) thirdly, moving a solder head down into engagement with the aligned set of clamped leads for soldering them together.

23. The invention as set forth in claim 22 wherein said first step (a) comprising holding the microelectronic device in a predetermined position in a holder by means of an applied vacuum, and placing a pin of the holder into a receiving hole formed in the printed circuit board for alignment purposes.

References Cited

UNITED STATES PATENTS

| | | | |
|---|---|---|---|
| 3,165,818 | 1/1965 | Soffa | 219—103 X |
| 3,271,555 | 9/1966 | Hirshon | 219—85 |
| 3,283,119 | 1/1966 | Hromadka | 219—85 |

RICHARD H. EANES, JR., *Primary Examiner.*